United States Patent

Beaman et al.

[11] Patent Number: 5,738,531
[45] Date of Patent: Apr. 14, 1998

[54] SELF-ALLIGNING LOW PROFILE SOCKET FOR CONNECTING BALL GRID ARRAY DEVICES THROUGH A DENDRITIC INTERPOSER

[75] Inventors: Daniel Paul Beaman; John Saunders Corbin, Jr., both of Austin; Danny Edward Massey, Georgetown, all of Tex.

[73] Assignee: International Business Machines Corporation, Armonk, N.Y.

[21] Appl. No.: 709,960

[22] Filed: Sep. 9, 1996

[51] Int. Cl.⁶ .................................................. H01R 9/09
[52] U.S. Cl. ................................ 439/71; 439/331; 439/66
[58] Field of Search .................................. 439/71, 73, 66, 439/331

[56] References Cited

U.S. PATENT DOCUMENTS

| | | | |
|---|---|---|---|
| 4,381,131 | 4/1983 | Demnianiuk | 439/368 |
| 4,652,973 | 3/1987 | Baker et al. | 361/395 |
| 4,679,118 | 7/1987 | Johnson et al. | 361/386 |
| 4,748,495 | 5/1988 | Kucharek | 357/82 |
| 4,923,404 | 5/1990 | Redmond et al. | 439/71 |
| 4,933,808 | 6/1990 | Horton et al. | 361/336 |
| 5,161,983 | 11/1992 | Ohno et al. | 439/71 |
| 5,302,853 | 4/1994 | Volz et al. | 257/707 |
| 5,313,099 | 5/1994 | Tata et al. | 257/717 |
| 5,397,245 | 3/1995 | Roebuck et al. | 439/264 |
| 5,397,919 | 3/1995 | Tata et al. | 257/717 |
| 5,451,165 | 9/1995 | Cearley-Cabbiness et al. | 439/71 |
| 5,468,157 | 11/1995 | Roebuck et al. | 439/264 |
| 5,468,158 | 11/1995 | Roebuck et al. | 439/264 |
| 5,468,996 | 11/1995 | Chan et al. | 257/723 |
| 5,477,161 | 12/1995 | Kardos et al. | 324/755 |
| 5,493,475 | 2/1996 | Lin | 361/710 |

*Primary Examiner*—Neil Abrams
*Assistant Examiner*—T. C. Patel
*Attorney, Agent, or Firm*—Casimer K. Salys

[57] ABSTRACT

A self-aligning low profile socket for connecting a ball grid array type device through a dendritic interposer to a printed circuit board, the socket providing resources for attaching a heat sink to the electronic device with minimum thermal impedance. Compressive forces are evenly distributed over the pattern of the interposer array, and thermal conductivity is provided between the top of the electronic device and a heat sink, through the use of complementary concave and convex surfaces engaged by a flat screw mechanism. The socket exhibits a low profile while providing the flexibility of a dendritic interposer and effective heat sink attachment.

11 Claims, 3 Drawing Sheets

SOLDER BALLS 2

DENDRITE PLATED VIAS/PADS 6

SELF-ALLIGNING LOW PROFILE SOCKET FOR CONNECTING BALL GRID ARRAY DEVICES THROUGH A DENDRITIC INTERPOSER

CROSS-REFERENCE TO RELATED APPLICATION

The invention in the present application is related to the subject matter in co-pending U.S. patent application Ser. No. 08/536,880, filed Sep. 29, 1995. The identified co-pending application is assigned to the assignee of the present application.

FIELD OF THE INVENTION

The present invention relates generally to the connection of electronic devices. More particularly, the invention is directed to a self-aligning low profile socket for connecting a ball grid array electronic device to a printed circuit board while retaining an efficient thermal path from the electronic device to a heat sink mounted on the socket.

BACKGROUND OF THE INVENTION

Shrinking integrated circuit dimensions and greater functionality have dramatically increased the number of input/output connections to integrated circuit packages while decreasing the dimensions available for making the connections. These trends have led to die packaging technologies which utilize ball grid arrays, column grid arrays, and land grid arrays (hereinafter generally referred to as "ball grid arrays") for input/output connections, in contrast to the peripherally located wire or pin array technologies characterizing conventional designs. The flip-chip technology is a particularly efficient example in that the input/output connections are part of a ball grid array of solder formed directly onto the integrated circuit die, effectively dispensing with the die package.

The use of a ball grid array to connect integrated circuit packages, die, or even modules with multiple die, to a printed circuit board materially increases the relative density of connections attainable when compared to other connection techniques. Unfortunately, ball grid array configured components suffer in two respects. First, it is difficult to make reliable temporary connections to the balls of the device for purposes of testing or burn-in. Secondly, if a defective connection occurs between a solder ball of the grid and a printed circuit board land during reflow attachment it is difficult to locate and correct the defective solder connection. In most cases, the complete device must be desoldered.

Developers of the assignee recently discovered that palladium dendrites formed by the plating of metal vias or pads can be used to make reliable connections between vies or pads and solder balls of ball grid array integrated circuit devices. Connections between the dendrite covered pads or vias and solder balls were found to be particularly effective in that the dendrites penetrate the solder ball surface oxides, for reliable electric connections, and become embedded into the relatively softer solder sufficiently to produce a mechanical bond and seal between the dendrite covered via or pad and the solder ball. The related concepts are described in U.S. Pat. No. 5,137,461 and IBM Technical Disclosure Bulletin Volume 36, No. 7, July 1993, pages 137 and 138, the subject matter of both references being incorporated herein by reference.

The industry trend toward larger die sizes, faster clock rates and decreased transistor dimensions has led to integrated circuit devices which require heat sinks to maintain a suitable operating temperature. The use of the heat sink naturally implies that there be a low thermal impedance between the integrated circuit die or package where the energy is being generated and the heat sink body where the energy is being dissipated. It is well known that the conduction of heat between solid bodies is improved with contact pressure between mating surfaces, such as will exist between the integrated circuit device, whether that be a module, ceramic package or flip-chip die, and the body of the heat sink or intervening thermally conductive element.

A socket which utilizes a dendritic interposer to connect a ball grid array device to a printed circuit board, such that the integrated circuit device can be readily removed, is taught in the aforementioned co-pending U.S. patent application having Ser. No. 08/536,880. Though the socket is effective in utilizing an interposer to make the connection, the heat sinking capability of the socket is limited in, that the design does not allow easy attachment of a fin type heat sink through a low thermal impedance path. Furthermore, the fundamental design of the aforementioned socket was not directed toward a low profile, the low profile design being particularly important with smaller computer enclosures and the space needed for the fins of the heat sink.

Therefore, a need exists for a low profile socket suitable to connect a ball grid array device through a dendritic interposer to a printed circuit board, the socket having the capability to align planar surfaces and provide pressure so as to minimize the thermal impedance between the integrated circuit and a heat sink conductively connected thereto.

SUMMARY OF THE INVENTION

The problems of the prior art are addressed and solved through any electronic device socket which is self-aligning, exhibits a low profile, is suitable for connection of a ball grid array device to a printed circuit board through a dendritic interposer, and provides resources for a low thermal path between the device and a heat sink situated on the socket. The socket comprises a planar interposer composed of dielectric material having a multiplicity of vias or pads covered with dendrites, which vias or pads are distributed in a pattern substantially conforming to the electronic ball grid device, means for aligning pads or vias of the interposer to contact regions on a printed circuit board, means for locating a pattern of balls on a surface of the ball grid array device to align the pattern of balls to pads or vias on the interposer, a frame member affixed to the printed circuit board, actuation means mounted in the frame member for adjustably compressing the planar interposer as aligned between the circuit board and the electronic ball grid array device, wherein the actuation means includes a first substantially planar thermally conductive member having a first side with a planar surface suitable to contact a surface of the electronic ball grid array device not having a pattern of balls and a second side with a surface of convex or concave contour, a second substantially planar thermally conductive member having a side with a surface of complementing match to the convex or concave surface of the first member, and means for connecting a heat sink to establish thermal contact with a second member in the actuation means.

Further refinements include the use of a backing plate suitable for supporting the printed circuit board from the side opposite the contact region, and means for connecting the backing plate to the frame member. A still further refinement includes an adjustable actuation means comprising a slide plate with a hole having inside threads to engage a matching set of outside threads formed in the first substantially planar thermally conductive member.

In a particularized form of the socket, a backing plate situated on the underside of the printed circuit board has posts extending through precisely located holes in the printed circuit board to engage a frame member having a slide plate mounted in the frame member. The slide plate has a large hole with threaded inner walls which engage a low profile set screw actuator. The screw actuator has a lower concave surface which engages an underlying complementary matching convex surface on a swivel plate, the screw actuator and swivel plate being composed of thermally conductive material. An interposer, and a locator are aligned by holes engaging the pins, wherein the locator then aligns the balls of the integrated circuit device directly to the pins and the printed circuit board lands. The thermal path between the integrated circuit device and the screw actuator extends through the swivel plate, with the screw actuator applying the pressure. The heat sink is mounted in thermal contact with the screw actuator. The result is a low profile, low thermal impedance, dendritic connection socket.

These and other features of the invention will be more clearly understood and appreciated upon considering the detailed embodiment described hereinafter.

DESCRIPTION OF THE PREFERRED EMBODIMENT

Figure 1:
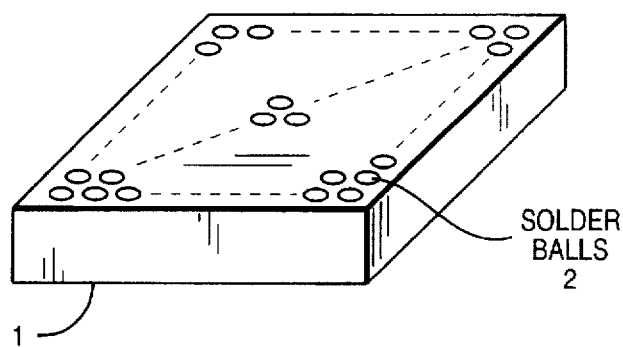
FIG. 1 depicts a flip-chip die, ceramic ball grid array package, or ball grid array module with an array of solder balls for electrical connection.

FIG. 1 schematically depicts an integrated circuit device 1 which is to be connected to a printed circuit board through an array of solder balls 2. Device 1 can be a flip-chip die, a die mounted within a package (typically a ceramic package with a cap) or can be a multiple chip module (typically a ceramic package with multiple die). Solder balls 2 are generally distributed in an array over one side of the device and are individually hemispherical in shape. The solder balls are typically composed of high melting temperature solder (10/90 of lead/tin) so that the profile of the solder balls is retained when connections are made by reflowing low melting temperature solder. As noted earlier, the array on the die or packages can be composed of column grid array and land grid array solder structures. One of the objectives of this invention is to avoid the reflow connection for purposes of test, burn-in and final manufacture while providing a reliable connection to the printed circuit board lands.

The invention will be described in the context of connecting a solder ball grid array device to a printed circuit board. However, the fundamental concepts are fully applicable to devices employing other solder structure arrays.

Figure 2:
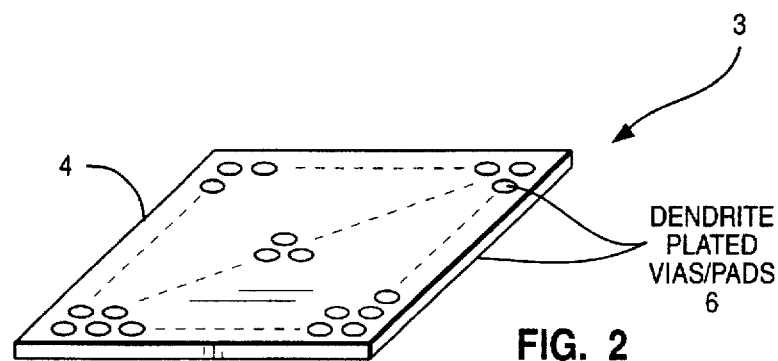
FIG. 2 depicts an interposer of dendrite plated vias or pads on opposite sides.
Figure 3:
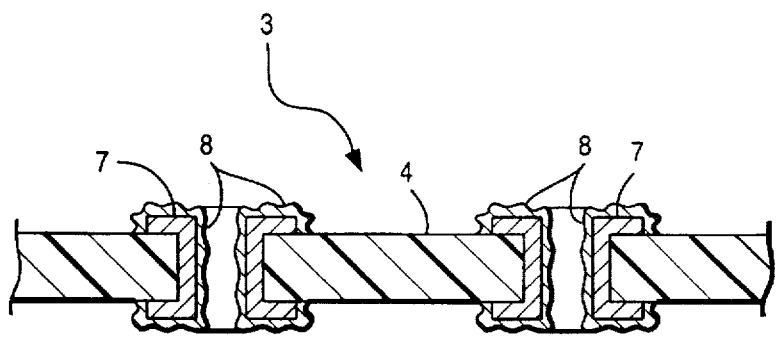
FIG. 3 schematically depicts by cross section two dendrite plated vias of an interposer.

FIG. 2 schematically depicts a thin interposer 3, the interposer having dielectric body 4 and multiple vias and/or pads on opposite sides. Palladium dendrites 8 are shown plated onto copper vias 7 in the cross section of FIG. 3. A further description of the interposer appears in IBM Technical Disclosure Bulletin Volume 37, No. 10, October 1994 on pages 35 and 36, incorporated herein by reference.

Figure 4:
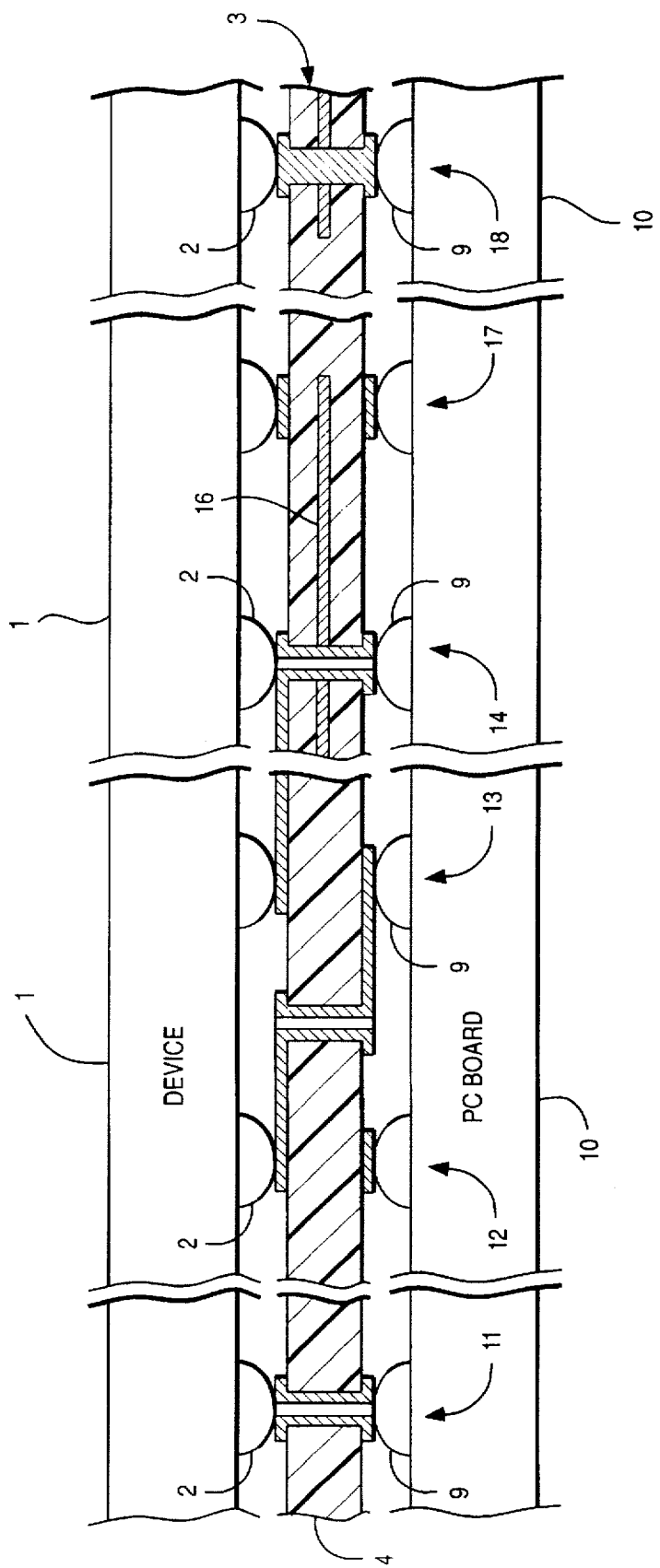
FIG. 4 schematically depicts the connection of a ball grid array device to a printed circuit board using an interposer with dendrite covered vias and pads.

FIG. 4 schematically illustrates the use of interposer 3 to connect solder balls 2 of electronic integrated circuit 1 to solder covered lands 9 of printed circuit board 10. In this context, the dendrites plated on the outer surfaces of interposer 3, are embedded into solder balls 2 and solder deposits 9 when device 1 and printed circuit board 10 are compressively connected. Note that the dendrites described in the aforementioned patent create not only the electrical connection between solder deposits 2 and 9, but also a physical attachment which remains viable even in the absence of further compressive force.

FIG. 4 illustrates the flexibility of using an interposer, where, as shown at 11, the device to printed circuit board connection is vertically aligned while, as shown at 12 and 13, the electrical path is translated by the wiring pattern of interposer 3. Further refinements are shown at 14, where an conductive inner layer 16 allows further interconnection while the solder deposits aligned at 17 remain electrically disconnected. The via at 18 illustrates that the interposer can have solid plated vias without affecting its usability in the manner described.

Although the interposer provides tremendous capability and flexibility, the socket for mounting the device has proven to be a challenge. One solution was developed and described in the aforementioned co-pending U.S. patent application Ser. No. 08/536,880. However, as noted earlier, that socket design has limited alignment resources for evenly distributing compressive forces, does not undertake to provide a low profile, and most significantly does not provide a compact and efficient thermal path and mechanical interface for attaching a heat sink or other heat removal device. The present invention addresses and solves those problems.

Figure 5:
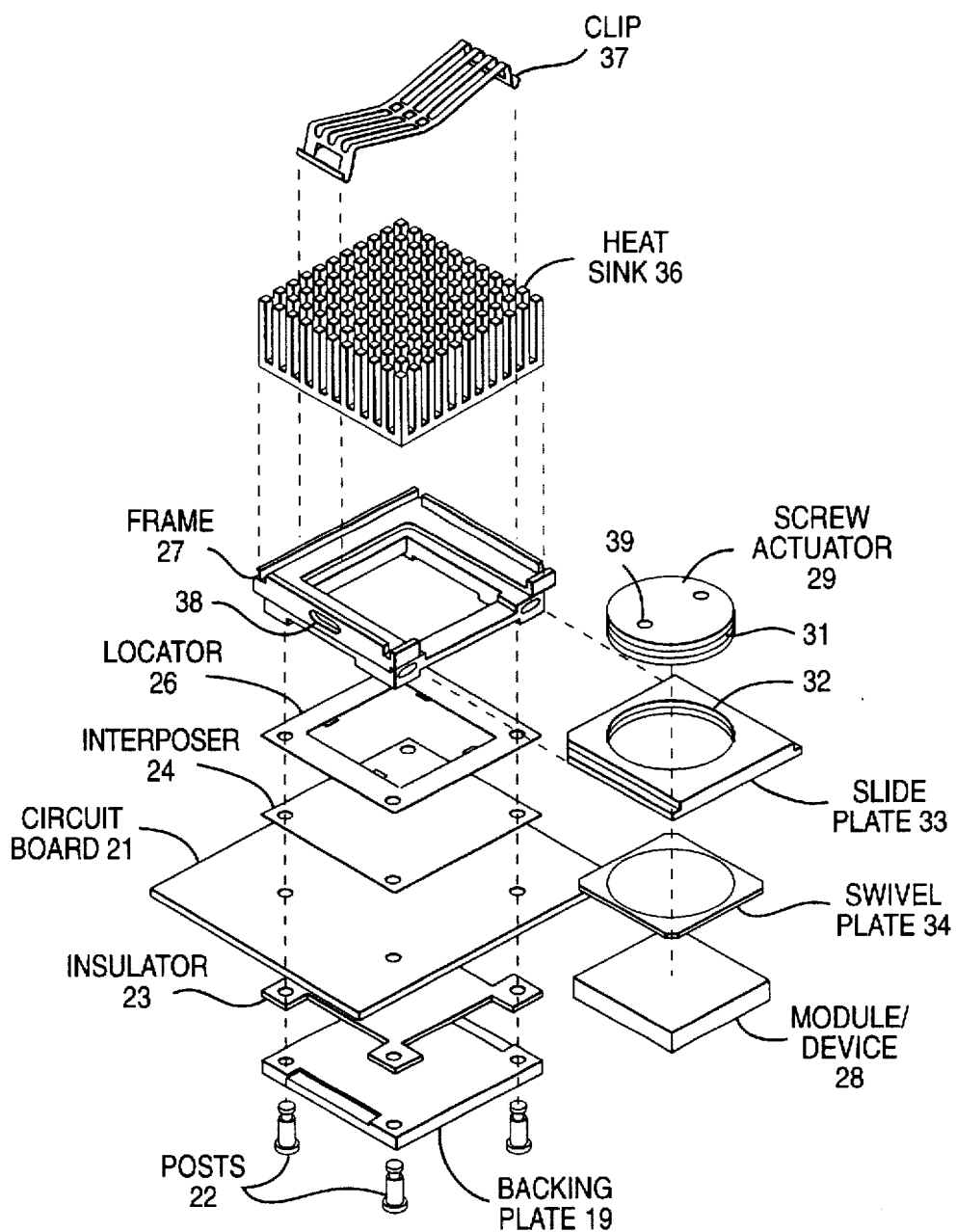
FIG. 5 depicts in an exploded view a preferred embodiment of the socket and its relation to the printed circuit board and the ball grid array device.

One embodiment of the present invention is depicted by exploded assembly view in FIG. 5. With reference to FIG. 5, the socket includes backing plate 19, typically fabricated from steel or other rigid material suitable to provide a uniform load distribution over the contact array. Four locating posts 22 are situated typically by press fit into backing plate 19. Posts 22 locate backing plate 19 using a matching hole pattern in circuit board 21. One post/hole pair may be made smaller than the remaining three pairs to provide a specific orientation of the socket with respect to the printed circuit board 21, if so desired. Since backing plate 19 is metallic and therefore an electrical conductor, insulator 23 is installed from the back side of printed circuit board 21, typically composed of a polyamide, to avoid shorting of adjacent land, vias or other conductive elements. If the backing plate is nonconductive, insulator 23 is unnecessary. Obviously, insulator 23 is also not needed if the underside of circuit board 21 at the location of backing plate 19 has no conductive paths. Posts 22 on backing plate 19 protrude through the whole pattern in circuit board 21 and provide locations which position both dendritic interposer 24 and locator 26.

Interposer 24 is made from a thin sheet of dielectric, such as commercially available Kapton or Driclad, and has an array of dendritic covered pads on both sides, as described hereinbefore with reference to FIG. 2. The shape and size of the dendritic pad array matches the solder ball pattern of the device to be socketed, whether that is a flip chip device, a ceramic package device, or a module device, such as described hereinbefore with reference to FIG. 1. An individual dendritic pad on top of the interposer is normally connected to a corresponding pad on the bottom of the interposer, forming a conductive path through the interposer. However, as noted hereinbefore with reference to FIG. 4, the interposer may reconfigure the connection path between the electronic device and printed circuit board as may on occasion be necessary for testing, defect correction, or device substitution.

Locator 26 is made from dielectric with an array of holes matching the device to be connected. The balls of the device slip through holes in the locator to allow proper registration of the module over the interposer pads and conduction through the locator. It is possible, as shown by the locator in FIG. 5, to use a limited number of holes while accomplishing the alignment necessary. The use of the locator is preferred over a positioning scheme using the body of the module as a reference for alignment with the interposer in that the ball grid array pattern is more accurately positioned by direct alignment rather than through relatively inaccurate reference to the body of the device.

Frame 27 is positioned on posts 22 which protrude through circuit board 21, interposer 24 and locator 26. On the underside of frame 27 are elongated slots which engage grooves in the tops of posts 22. Assembly is accomplished by dropping frame 27 over posts 22 and then repositioning frame 27 laterally to engage the slots with the grooves in post 2. At this point the assembly of the socket is completed and ready for device insertion.

Installation of the electronic device is accomplished by positioning the device after proper orientation within frame 27 while simultaneously engaging the ball grid array pattern with the positioning holes in locator 26. This positioning aligns the array pattern of device 28 solder balls with a like pattern array of dendritic connections on interposer 24, all of which are concurrently aligned with a like pattern array of contacts on circuit board 21. Device 28 is loaded against circuit board 21 to complete the dendritic interconnection. Loading is accomplished by screw actuator 29, which is a large diameter, cylindrical, thermally conductive element with external threads 31 which engage a complementary set of inside threads 32 in a hole through slide plate 33. Swivel plate 34 is placed between slide plate 33 and the top of electronic device 29.

Figure 6:
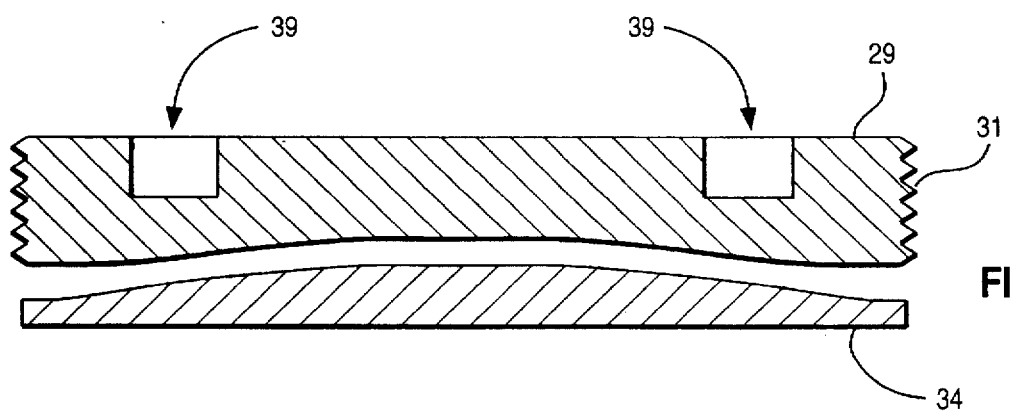
FIG. 6 depicts by schematic cross section the complementing surfaces between the screw actuator and swivel plate which provides the self alignment and low thermal impedance.

Screw actuator 29 and swivel plate 34 are shown by cross section in FIG. 6. Swivel plate 34 is a critical element of the socket in that it compensates for surface misalignment between the bottom of screw actuator 29 and the top of device 28 while providing a low thermal impedance path therebetween. Alignment is accomplished by having the convex hemispherical surface on the top of swivel plate 34 engage a complementing concave hemispherical surface on the bottom of screw actuator 29. The mating surface contours allow swivel plate 34 to rotate while retaining surface to surface contact from the top of device 28, through thermally conductive swivel plate 34, through the hemispherical surface contact between swivel plate 34 and screw actuator 29, and into thermally conductive screw actuator 29. The presence of good surface to surface contact is imperative to provide a good thermal path for heat to flow from device 28 to a heat sink, cold plate or other cooling device conductively contacting the top surface of screw actuator 29. FIG. 5 shows that heat sink 36 is compressively connected to the top surface of screw actuator 29 using clip 37 once the tangs of clip 37 engages holes 38 in frame 27.

To enhance the thermal path, swivel plate 34 and screw actuator 29 are preferably fabricated from a material with a high thermal conductivity, such as copper or aluminum. Additionally, a thin film of oil is typically applied to the mating surfaces within the thermal path.

Once device 28 is positioned within frame 27, swivel plate 34 is placed on top of device 28. Screw actuator 29 engages in the mating threads of slide plate 33, slide plate 33 being capable of lateral movement within frame 27. Loads applied through screw actuator 29 are transmitted into frame 27 through the shoulders on slide plate 33 which engages grooves in frame 27, thereby clamping device 28 and circuit board 21 between socket backing plate 19 and screw actuator 29. Loading of the electronic device module is accomplished by applying torque through screw actuator 29 by engaging holes 39 with a spanner wrench or the like as a torquing tool.

Note that the completed device provides a low profile socket with a structural anchor for attaching a heat sink, and that the heat sink is connected through a low thermal impedance path to the electronic device by virtue of self aligning contact surfaces of relatively large area and evenly distributed compressive force.

It will be understood by those skilled in the art that the embodiment set forth hereinbefore are merely exemplary of the numerous arrangements by which the invention may be practiced, and as such may be replaced by equivalents without departing from the invention which will now be defined by appended claims.

We claim:

1. A socket, comprising:
    a planar interposer composed of dielectric material having a multiplicity of vias or pads covered with dendrites, which vias or pads are distributed in a pattern substantially conforming to an electronic ball grid array device;
    means for aligning pads or vias of the interposer to contact regions on a printed circuit board;
    means for locating a pattern of balls on a surface of the ball grid array device to align the pattern of balls to pads or vias of the interposer;
    a frame member affixable to the printed circuit board;
    actuation means mounted in the frame member for adjustably compressing the planar interposer as aligned between the circuit board and the electronic ball grid array device, wherein the actuation means comprises:
        a first substantially planar thermally conductive member having a first side with a planar surface suitable to contact a surface of the electrical ball grid array device not having a pattern of balls and a second side with a surface of convex or concave contour;
        a second substantially planar thermally conductive member having a side with a surface of complementing match to the convex or concave surface of the first member; and
        means for connecting a heat sink to establish thermal contact with the second member in the actuation means.

2. The apparatus recited in claim 1, further comprising:
    a backing plate suitable for supporting printed circuit board from the side opposite the contact region; and
    means for connecting the backing plate to the frame member.

3. The apparatus recited in claim 2, wherein the adjustable actuation means comprises a plate engaging the frame member with a hole having inside threads engaging a matching set of outside threads formed on the first substantially planar thermally conductive member.

4. The apparatus recited in claim 2, wherein the means for connecting the backing plate are pins which extend from the backing plate to the frame member, which align the pads or vias of the interposer, and which position the means for locating.

5. The apparatus recited in claim 3, wherein the means for connecting the backing plate are pins which extend from the backing plate to the frame member, which align the pads or vias of the interposer, and which position the means for locating.

6. The apparatus recited in claim 4, wherein the planar interposer is composed of multiple layers with patterned electrical paths connecting selected vias or pads.

7. The apparatus recited in claim 5, wherein the planar interposer is composed of multiple layers with patterned electrical paths connecting selected vias or pads.

8. The apparatus recited in claim 6, wherein the pattern of contact regions on the printed circuit board is comprised of solder covered lands.

9. The apparatus recited in claim 8, wherein the means for locating the pattern of solder balls on the surface of the ball grid array device mates with the balls of the ball grid array device.

10. The apparatus recited in claim 7, wherein the pattern of contact regions on the printed circuit board is comprised of solder covered lands.

11. The apparatus recited in claim 9, wherein the means for locating the pattern of solder balls on the surface of the ball grid array device mates with the balls of the ball grid array device.

* * * * *